(12) United States Patent
Rofougaran et al.

(10) Patent No.: US 8,242,858 B2
(45) Date of Patent: Aug. 14, 2012

(54) METHOD AND SYSTEM FOR MATCHING NETWORKS EMBEDDED IN AN INTEGRATED CIRCUIT PACKAGE

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 13/345,029

(22) Filed: Jan. 6, 2012

(65) Prior Publication Data
US 2012/0105168 A1   May 3, 2012

Related U.S. Application Data

(63) Continuation of application No. 11/956,071, filed on Dec. 13, 2007, now Pat. No. 8,115,567.

(51) Int. Cl.
*H03H 7/38* (2006.01)

(52) U.S. Cl. ........................................................ 333/32

(58) Field of Classification Search ............... 333/32, 333/33, 246, 247
See application file for complete search history.

(56) References Cited

U.S. PATENT DOCUMENTS
7,515,879 B2 * 4/2009 Okabe et al. ............ 455/73

* cited by examiner

*Primary Examiner* — Stephen Jones
(74) *Attorney, Agent, or Firm* — Farjami & Farjami LLP

(57) ABSTRACT

Methods and systems for matching networks embedded in an integrated circuit package are disclosed and may include controlling impedance within an integrated circuit via one or more impedance matching networks. The impedance matching networks may be embedded within a multi-layer package bonded to the integrated circuit. The impedance of one or more devices within the integrated circuit may be configured utilizing the impedance matching networks. The multi-layer package may include one or more impedance matching networks. The impedance matching networks may provide impedance matching between devices internal to the integrated circuit and external devices. The impedance matching networks may be embedded within the multi-layer package, and may include transmission lines, inductors, capacitors, transformers and/or surface mount devices. The impedance matching networks may be deposited on top of and/or on bottom of the multi-layer package. The integrated circuit may be flip-chip bonded to the multi-layer package.

8 Claims, 5 Drawing Sheets

METHOD AND SYSTEM FOR MATCHING NETWORKS EMBEDDED IN AN INTEGRATED CIRCUIT PACKAGE

CROSS-REFERENCE TO RELATED APPLICATIONS/INCORPORATION BY REFERENCE

The present application is a Continuation of U.S. application Ser. No. 11/956,071, filed Dec. 13, 2007 now U.S. Pat. No. 8,115,567.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for matching networks embedded in an integrated circuit package.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for matching networks embedded in an integrated circuit package, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Figure 1:
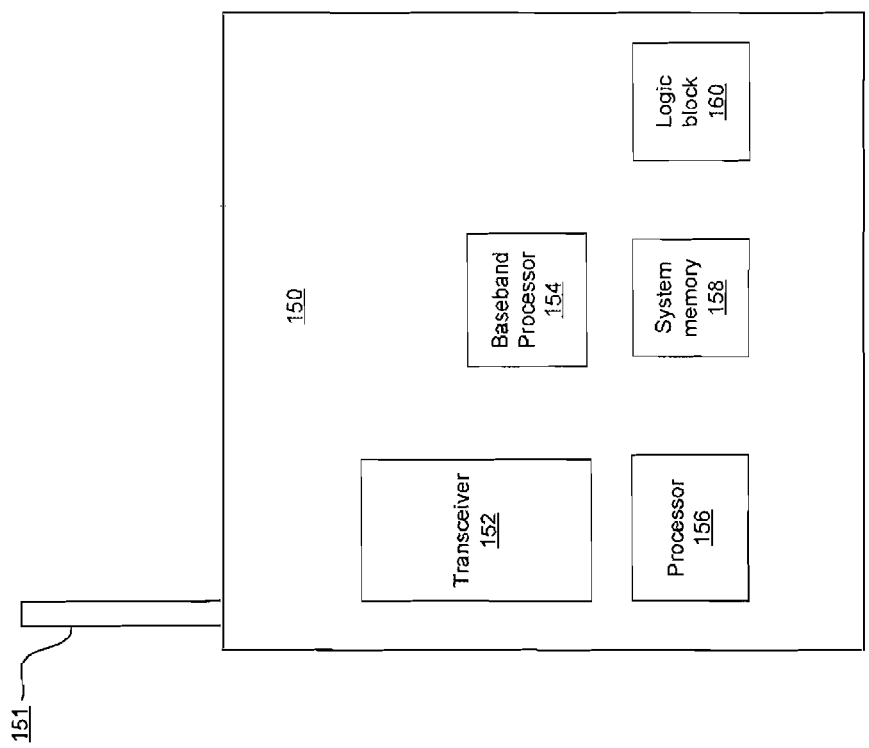
FIG. 1 is a block diagram of an exemplary wireless system, which may be utilized in accordance with an embodiment of the invention.

Certain aspects of the invention may be found in a method and system for matching networks embedded in an integrated circuit package. Exemplary aspects of the invention may comprise controlling impedance within an integrated circuit via one or more impedance matching networks. The impedance matching networks may be embedded within a multi-layer package bonded to the integrated circuit. The impedance of one or more devices within the integrated circuit may be configured utilizing the impedance matching networks. The multi-layer package may comprise one or more impedance matching networks. The impedance matching networks may provide impedance matching between devices internal to the integrated circuit and external devices. The impedance matching networks may be embedded within the multi-layer package, and may comprise transmission lines, inductors, capacitors, transformers and/or surface mount devices. The impedance matching networks may be deposited on top of and/or on bottom of the multi-layer package. The integrated circuit may be flip-chip bonded to the multi-layer package FIG. 1 is a block diagram of an exemplary wireless system, which may be utilized in accordance with an embodiment of the invention. Referring to FIG. 1, the wireless system 150 may comprise an antenna 151, a transceiver 152, a baseband processor 154, a processor 156, a system memory 158, and a logic block 160. The antenna 151 may be used for reception and/or transmission of RF signals.

The transceiver 152 may comprise suitable logic, circuitry, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151. Different wireless systems may use different antennas for transmission and reception. The transceiver 152 may be enabled to execute other functions, for example, filtering the baseband and/or RF signals, and/or amplifying the baseband and/or RF signals.

In an embodiment of the invention, the transceiver 152 may be integrated on a multi-layer package comprising impedance matching devices on the top and bottom surfaces as well as embedded within the package. The package may comprise a multi-layer structure to which integrated circuits may be flip-chip bonded. The incorporation of impedance matching devices on integrated circuits gets increasingly challenging as the frequency of operation of devices increases. Additionally, incorporating devices on an integrated circuit may take valuable chip real estate, increasing chip size and cost. By utilizing impedance matching elements in the package, the size of these devices may be greatly reduced, which may be increasingly important as the frequency of operation of the wireless system 150 may be extended to the 60 GHz range.

Impedance matching devices incorporated into the wireless system 150 may comprise, transformers, baluns, transmission lines, inductors, and/or capacitors, for example. In another embodiment of the invention, impedance matching devices may comprise surface mount devices soldered to the multi-layer package, described further with respect to FIG. 2.

The baseband processor 154 may comprise suitable logic, circuitry, and/or code that may be enabled to process baseband signals for transmission via the transceiver 152 and/or the baseband signals received from the transceiver 152. The processor 156 may be any suitable processor or controller such as a CPU or DSP, or any type of integrated circuit processor.

The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154.

Control and/or data information, which may comprise the programmable parameters, may be transferred from other portions of the wireless system 150, not shown in FIG. 1, to the processor 156. Similarly, the processor 156 may be enabled to transfer control and/or data information, which may include the programmable parameters, to other portions of the wireless system 150, not shown in FIG. 1, which may be part of the wireless system 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156. The system memory 158 may comprise suitable logic, circuitry, and/or code that may be enabled to store a plurality of control and/or data information, including parameters needed to calculate frequencies and/or gain, and/or the frequency value and/or gain value.

The logic block 160 may comprise suitable logic, circuitry, and/or code that may enable controlling of various functionalities of the wireless system 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

Figure 2:
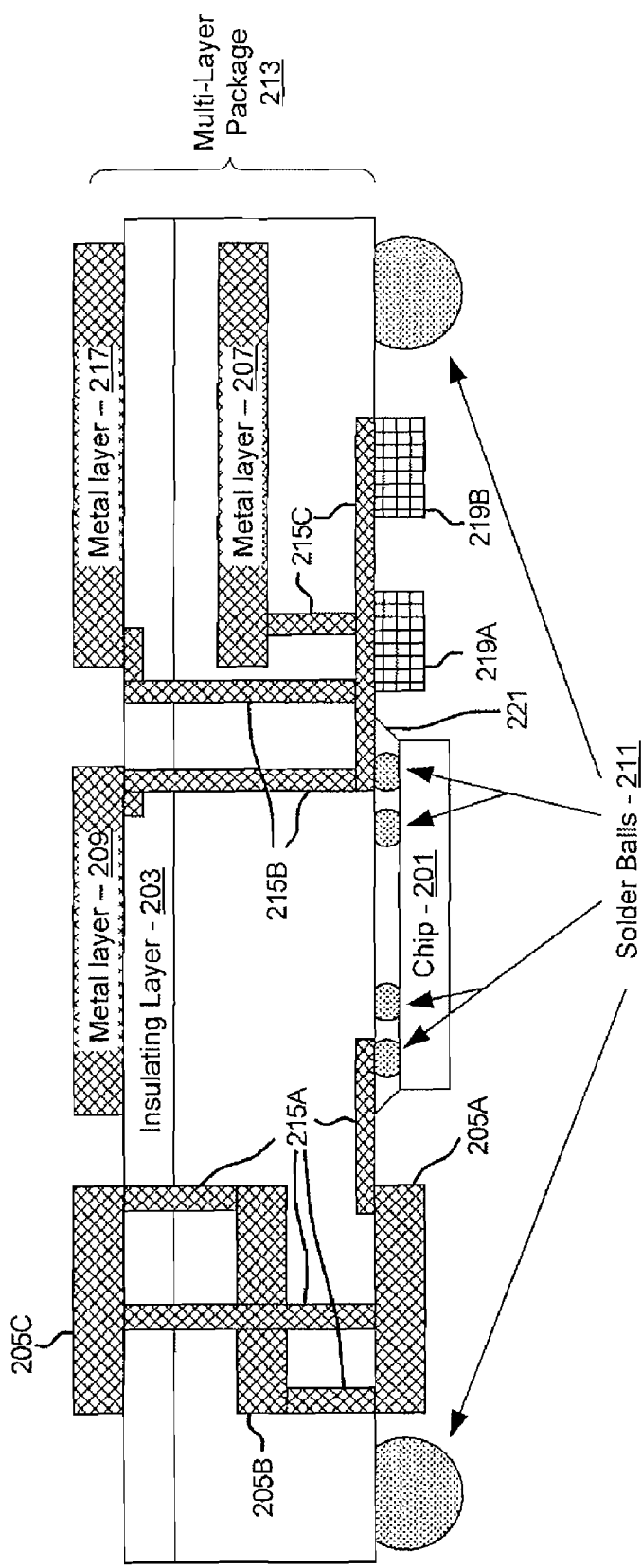
FIG. 2 is a block diagram illustrating a cross sectional view of a multi-layer package with integrated matching networks, in accordance with an embodiment of the invention.

FIG. 2 is a block diagram illustrating a cross sectional view of a multi-layer package with integrated matching networks, in accordance with an embodiment of the invention. Referring to FIG. 2, there is shown a chip 201, an insulating layer 203, metal layers 205A, 205B, 205C, 207, 209, 215A, 215B, 215C and 217, solder balls 211, multi-layer package 213, surface mount components 219A and 219B, and thermal epoxy 221.

The chip 201, or integrated circuit, may comprise the transceiver 152 described with respect to FIG. 1, or may also comprise any other integrated circuit within the wireless system 150 that may require impedance matching components and/or devices. The chip 201 may be bump-bonded or flip-chip bonded to the multi-layer package 213 utilizing the solder balls 211. In this manner, wire bonds connecting the chip 201 to the multi-layer package 213 may be eliminated, reducing and/or eliminating uncontrollable stray inductances due to wire bonds. In addition, the thermal conductance out of the chip 201 may be greatly improved utilizing the solder balls 211 and the thermal epoxy 221. The thermal epoxy 221 may be electrically insulating but thermally conductive to allow for thermal energy to be conducted out of the chip 201 to the much larger thermal mass of the multilayer package 213.

The metal layers 205A, 205B, 205C, 207, 209, 215A, 215B, 215C and 217 may comprise deposited metal layers utilized to delineate impedance matching devices. The metal layer 209 may be patterned such that it may comprise a transmission line that may be utilized to impedance match a power amplifier in the chip 201 to an antenna, such as the antenna 151 described with respect to FIG. 1, for example. In another embodiment of the invention, the metal layers 201 and 217 may comprise a microstrip structure, the impedance of which may be tuned, for example.

In an embodiment of the invention, one or more of the metal layers may comprise ferromagnetic and/or ferrimagnetic layers utilized to define devices such as transformers, inductors, baluns, isolators, circulators, and gyrators. Accordingly, the metal layers 205A, 205B, 205C and 215A may comprise a transformer that may be utilized to provide impedance matching between a power amplifier in the chip 201 and an antenna, for example.

The metal layers 215C may provide electrical contact to the surface mount devices 219a and 219B from the chip 201 via the solder balls 211. The number of metal layers may not be limited to the number of metal layers 205A, 205B, 205C, 207, 209, 215A, 215B, 215C and 217 shown in FIG. 2. Accordingly, there may be any number of layers embedded within the multi-layer package 213, depending on the number of contacts on the chip 201 coupled to the solder balls 211, and the number of impedance matching devices fabricated within and/or on the multi-layer package 213.

The solder balls 211 may comprise spherical balls of metal to provide electrical, thermal and physical contact between the chip 201 and the multi-layer package 213. In making the contact with the solder balls 211, the chip may be pressed with enough force to squash the metal spheres somewhat, and may be performed at an elevated temperature to provide suitable electrical resistance and physical bond strength. The thermal epoxy 221 may fill the volume between the solder balls 211 and may provide a high thermal conductance path for heat transfer out of the chip 201. The solder balls 211 may also be utilized to provide electrical, thermal and physical contact between the multi-layer package 213 and a printed circuit board comprising other parts of the wireless system 150, described with respect to FIG. 1.

The surface mount devices 219A and 219B may comprise discrete circuit elements such as resistors, capacitors, inductors, and diodes, for example. The surface mount devices 219A and 219B may be soldered to the multi-layer package 213 to provide electrical contact.

In operation, the chip 201 may comprise an RF front end, such as the RF transceiver 152, described with respect to FIG. 1, and may be utilized to transmit and receive RF signals. The chip 201 may be electrically coupled to impedance matching devices fabricated on and/or within the multi-layer package 213, such as transformers, baluns, transmission lines, inductors, capacitors and surface mount devices, for example. Heat from the chip 201 may be conducted to the multi-layer package via the thermal epoxy 221 and the solder balls 211.

Figure 3:
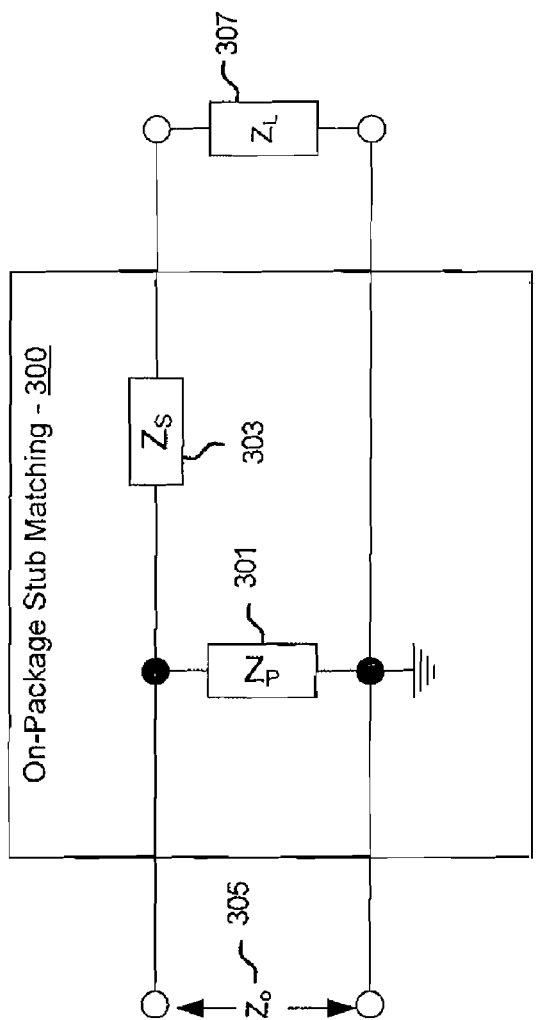
FIG. 3. is a block diagram illustrating an exemplary on-package stub matching network, in accordance with an embodiment of the invention.

FIG. 3. is a block diagram illustrating an exemplary on-package stub matching network, in accordance with an embodiment of the invention. Referring to FIG. 3, there is shown a stub matching circuit 300 comprising a parallel impedance 301 and a series impedance 303. The stub matching circuit 300 may be enabled to match the output impedance 305, such as from a power amplifier in the chip 201, for example, and the load impedance 307, such as from the antenna 151, described with respect to FIG. 1.

The parallel impedance 301 and the series impedance 303 may comprise transmission lines, for example, that may be tuned to provide impedance match between the output impedance 305 and the load impedance 307. The transmission lines may comprise metal layers, such as the metal layer 209 deposited on or embedded within the multi-layer package 213 described with respect to FIG. 2.

In another embodiment of the invention, the parallel impedance 301 and the series impedance 303 may comprise microstrip structures, such as the microstrip comprising the metal layers 207 and 217, described with respect to FIG. 2, for example. The impedance may be adjusted by changing the dimensions of the structure utilizing microelectromechanical systems (MEMS) switches, for example.

Figure 4:
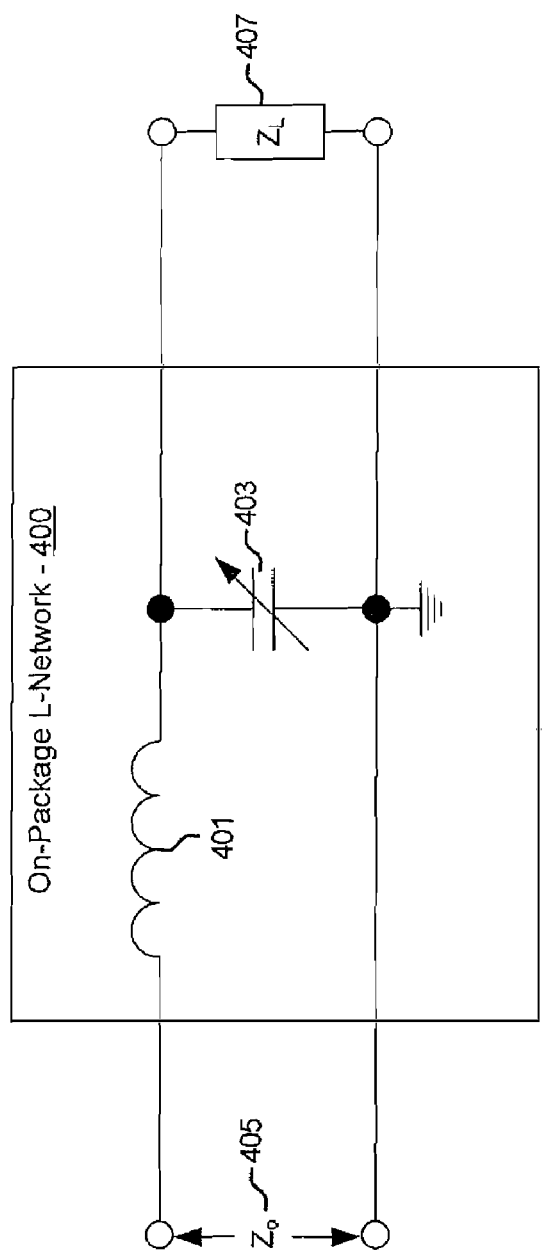
FIG. 4 is a block diagram illustrating an exemplary on-package single-ended inductance-network, in accordance with an embodiment of the invention.

FIG. 4 is a block diagram illustrating an exemplary on-package single-ended inductance-network, in accordance with an embodiment of the invention. Referring to FIG. 4, there is shown a single-ended inductance (L) network 400 comprising an inductor 401 and a variable capacitance 403. The L-network 400 may be enabled to match the output impedance 405, such as from a power amplifier in the chip 201, for example, and the load impedance 407, such as from the antenna 151, described with respect to FIG. 1.

The inductor 401 may comprise an inductor integrated on the multi-layer package 213, described with respect to FIG. 2. For example, the inductor 401 may comprise a spiral conductor, for example, fabricated from the metal layer 209, described with respect to FIG. 2. In another embodiment of the invention, the inductor 401 may be fabricated utilizing ferromagnetic material, as described with respect to FIG. 2.

The variable capacitor 403 may comprise one or more capacitors fabricated on and/or embedded within the multi-layer package 213, which may be selected by the chip 201 for impedance matching the output impedance 405 with the load resistance 407. Each of the capacitors that comprise the variable capacitor 403 may be fabricated from parallel metal layers in the multi-layer package 213, such as the metal layers 207 and 217, for example. The number of layers comprising the variable capacitor 403 is not limited to the number shown in FIG. 2. Accordingly, any number of individual capacitors may be fabricated as per the capacitance values required for impedance matching.

Figure 5:
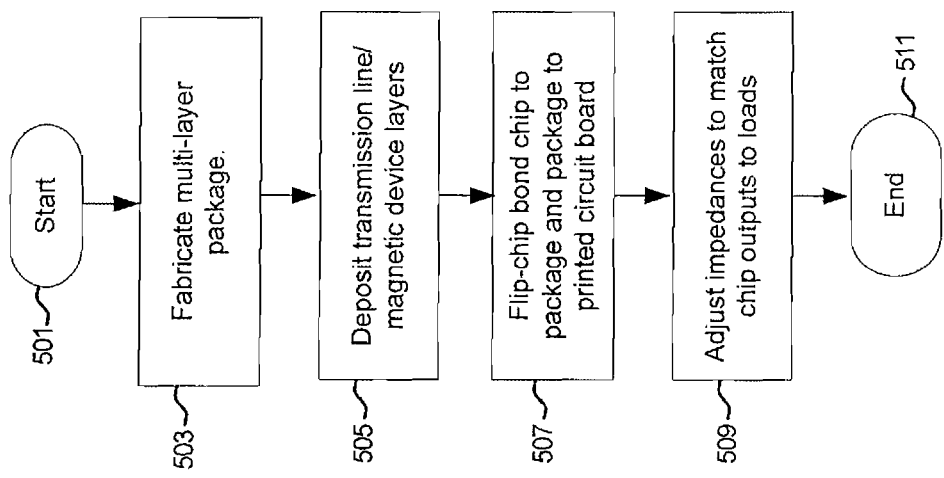
FIG. 5 is a flow diagram illustrating exemplary steps in the fabrication of matching networks embedded in a multi-layer package, in accordance with an embodiment of the invention.

FIG. 5 is a flow diagram illustrating exemplary steps in the fabrication of matching networks embedded in a multi-layer package, in accordance with an embodiment of the invention. In step 503, after start step 501, the multi-layer package may be fabricated with metal conductive and ferromagnetic layers embedded with the structure. In step 505, transmission line and magnetic layer devices may be deposited on the top and/or bottom surfaces of the multi-layer package. In step 507, a chip may be flip-chip bonded to the multi-layer package and the package may then be flip-chip bonded to a printed circuit board. Thermal epoxy may be utilized to fill the volume between the solder balls between the chip and the package. In step 509, the impedances of the impedance matching devices in the multi-layer package may be adjusted to match impedances between devices within the chip and external devices, followed by end step 511.

In an embodiment of the invention, a method and system are disclosed for controlling impedance within an integrated circuit 201 via one or more impedance matching networks 300, 400. The multi-layer package 213 may comprise one or more impedance matching networks 300, 400. The impedance matching networks 300, 400 may provide impedance matching between devices internal to the integrated circuit 201 and external devices 151. The impedance of one or more devices within the integrated circuit 201 may be configured utilizing the impedance matching networks 300, 400. The impedance matching networks 300, 400 may be embedded within the multi-layer package 213, and may comprise transmission lines, inductors 401, capacitors 403, transformers 205A, 205B, 205C and/or surface mount devices 219A, 219B. The impedance matching networks may be deposited on the top of and/or on the bottom of the multi-layer package 213. The integrated circuit 201 may be coupled to the multi-layer package 213 utilizing a flip-chip technique.

Certain embodiments of the invention may comprise a machine-readable storage having stored thereon, a computer program having at least one code section for enabling communication, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A packaged chip comprising:
   a multi-layer package having metal layers, the multi-layer package further having structures for providing an impedance, where the structures include the metal layers;
   an integrated circuit (IC) bonded to the multi-layer package and utilizing the impedance provided by the structures; and
   microelectromechanical switches (MEMS) configurable to change dimensions of the structures for adjusting the impedance.

2. The packaged chip of claim 1, wherein the structures are microstrip structures.

3. The packaged chip of claim 1, wherein the metal layers are fabricated in the multi-layer package.

4. The packaged chip of claim 1, wherein the metal layers are deposited metal layers.

5. The packaged chip of claim 1, wherein the IC is a transceiver circuit.

6. The packaged chip of claim 1, wherein the impedance includes a parallel impedance and a series impedance, and where the adjusting of the impedance adjusts at least one of the parallel impedance and the series impedance.

7. The packaged chip of claim 6, wherein the parallel impedance and the series impedance include transmission lines.

8. The packaged chip of claim 7, wherein the transmission lines are utilized to impedance match a power amplifier in the IC to an antenna.

* * * * *